(12) United States Patent
Kim et al.

(10) Patent No.: US 7,710,171 B2
(45) Date of Patent: May 4, 2010

(54) DELAYED LOCKED LOOP CIRCUIT

(75) Inventors: Kyung-Hoon Kim, Kyoungki-do (KR);
Bo-Kyeom Kim, Kyoungki-do (KR);
Taek-Sang Song, Kyoungki-do (KR)

(73) Assignee: Hynix Semiconductor, Inc.,
Gyeonggi-do (KR)

( * ) Notice: Subject to any disclaimer, the term of this patent is extended or adjusted under 35 U.S.C. 154(b) by 0 days.

(21) Appl. No.: 12/164,199

(22) Filed: Jun. 30, 2008

(65) Prior Publication Data

US 2009/0273381 A1    Nov. 5, 2009

(30) Foreign Application Priority Data

Apr. 30, 2008    (KR) ...................... 10-2008-0040278

(51) Int. Cl.
*H03L 7/06* (2006.01)
(52) U.S. Cl. ...................................... 327/158; 327/149
(58) Field of Classification Search ................ None
See application file for complete search history.

(56) References Cited

U.S. PATENT DOCUMENTS

| 5,801,562 | A  | * | 9/1998  | Fujii ........................ 327/149 |
| 6,417,715 | B2 | * | 7/2002  | Hamamoto et al. ......... 327/291 |
| 6,707,758 | B2 | * | 3/2004  | Kono ..................... 365/189.15 |
| 7,142,026 | B2 | * | 11/2006 | Kwak ......................... 327/158 |
| 7,161,398 | B2 | * | 1/2007  | Park et al. ................... 327/149 |
| 7,199,625 | B1 | * | 4/2007  | Chung ........................ 327/149 |
| 7,202,714 | B2 | * | 4/2007  | Park .......................... 327/149 |
| 7,282,973 | B1 | * | 10/2007 | Charagulla et al. .......... 327/158 |
| 7,388,415 | B2 | * | 6/2008  | Lee ............................ 327/158 |
| 7,414,445 | B2 | * | 8/2008  | Heyne ........................ 327/158 |
| 2007/0200604 | A1 | * | 8/2007 | Yun et al. .................... 327/158 |
| 2008/0088349 | A1 | * | 4/2008 | Lee ............................ 327/158 |

FOREIGN PATENT DOCUMENTS

| KR | 1020070016035 A | 2/2007 |
| KR | 1020070058800 A | 6/2007 |
| KR | 1020080001124 A | 1/2008 |
| KR | 1020080032972 A | 4/2008 |

* cited by examiner

*Primary Examiner*—Cassandra Cox
(74) *Attorney, Agent, or Firm*—IP & T Law Firm PLC

(57) ABSTRACT

A delay locked loop circuit for compensating for a phase skew of a memory device includes a first delay locking unit configured to delay an external clock of the memory device by a first amount of delay to output a first internal clock, a second locking unit configured to delay the external clock by a second amount of delay to output a second internal clock, the second amount of delay being greater than the first amount of delay, and a selecting unit configured to select one of the first internal clock and the second internal clock as an internal clock of the memory device.

13 Claims, 11 Drawing Sheets

DELAYED LOCKED LOOP CIRCUIT

CROSS-REFERENCE TO RELATED APPLICATION

The present invention claims priority of Korean patent application number No. 10-2008-0040278, filed on Apr. 30, 2008, which is incorporated by reference in its entirety.

BACKGROUND OF THE INVENTION

The present invention relates to a delay locked loop (DLL) circuit.

A DLL circuit is a circuit to control a timing of data output from a synchronous memory device by using an external clock signal.

In order to transfer output data of the memory device to a chipset without error, the memory device and the chipset should operate in synchronization with a clock signal. However, a phase difference occurs between an external clock and an internal clock because the external clock input to the memory device is delayed by internal circuits. A DLL circuit eliminates a phase difference between output data of the memory device and the external clock by compensating for clock skew occurring due to internal circuits.

FIG. 1 is a block diagram of a conventional DLL circuit.

Referring to FIG. 1, the conventional DLL circuit includes a phase comparator 103, a delay line 105, a delay controller 107, and a replica model 109.

The phase comparator 103 compares the phase of an external clock EXT_CLK with the phase of a feedback clock FB, which is fed back from the replica model 109, to detect the phase difference between the two clocks. The phase comparator 103 generates a control signal according to the detected phase difference. The delay controller 107 is implemented with a shift register, and determines amount of delay, that is, a shift direction and a shift amount of the external clock EXT_CLK, based on the detected phase difference, to control the delay line 105 according to the determined amount of delay. The external clock EXT_CLK input to the delay line 105 is delayed according to the amount of delay determined by the delay controller 107. The replica model 109 includes modeled clock delay components of the internal paths of the memory device. The replica model 109 delays the external clock EXT_CLK delayed by the delay line 105 according to the modeling of the replica model 109, and outputs the feedback clock FB to the phase comparator 103.

Through the above procedures, the external clock EXT_CLK is delayed by the delay line 105 and output as the feedback clock FB by the replica model 109. A phase of the feedback clock FB coincides with that of the external clock EXT_CLK. This is called a delay locking.

The amount of delay of the delay line 105, which is determined by the delay controller 107, is expressed as the following Equation 1.

$$DD = N \times TEXT - DFB \quad \text{Eq. 1}$$

where DD is the amount of delay of the delay line 105, that is, the amount of delay of the external clock EXT_CLK, TEXT is the period of the external clock EXT_CLK, DFB is the amount of delay of the feedback clock FB output from the replica model 109, and N is an integer determined according to design.

FIG. 2 is a timing diagram illustrating the amount of delay DD determined by a delay controller 107 of FIG. 1. Referring to FIG. 2, when the period TEXT of the external clock EXT_CLK is 5; N is 1; and the amount of delay DFB of the feedback clock FB output from the replica model 109 is 3, the amount of delay DD of the delay line 105 is 2. That is, the external clock EXT_CLK delayed by the amount of delay DD of the delay line 105 is output as the feedback clock FB through the replica model 109, and the phase of the feedback clock FB coincides with the phase of the external clock EXT_CLK. At this point, the amount of delay DD is locked.

According to the related art, the amount of delay DFB of the feedback clock FB output from the replica model 109 is influenced by a variety of factors, for example, a variation of a power source. If the amount of delay DFB of the feedback clock FB output from the replica model 109 increases, it becomes greater than the fixed value "N×TEXT" of Equation 1 and thus the locking may not be achieved.

To solve the above problem, the value of N should be increased. However, if the value of N is increased, the amount of delay DD of the delay line 105 also increases. Thus, a locking time increases and jitters are generated.

SUMMARY OF THE INVENTION

Embodiments of the present invention are directed to providing a DLL circuit that is capable of achieving the locking even though an amount of delay (DFB) of a feedback clock (FB) increases.

In accordance with an aspect of the invention, there is provided a delay locked loop circuit for compensating for a phase skew of a memory device, including: a first delay locking unit configured to delay an external clock of the memory device by a first amount of delay to output a first internal clock; a second locking unit configured to delay the external clock by a second amount of delay to output a second internal clock, the second amount of delay being greater than the first amount of delay; and a selecting unit configured to select one of the first internal clock and the second internal clock as an internal clock of the memory device.

In accordance with another aspect of the invention, there is provided a delay locked loop circuit for compensating a phase skew of a memory device, including: a first delay locking unit configured to delay an external clock by a first amount of delay to output a first internal clock; a second delay locking unit configured to delay the external clock by a second amount of delay according to the phase comparison result of the first internal clock and a second internal clock to output the second internal clock, where the second amount of delay is greater than the first amount of delay; and a selecting unit configured to select one of the first internal clock and the second internal clock as an internal clock of the memory device.

In accordance with another aspect of the invention, there is provided a delay locked loop circuit for compensating for a phase skew of a memory device, including: a plurality of delay locking units each having a different amount of delay and configured to delay an external clock of the memory device by the different amount of delay to output a plurality of internal clocks; and a selecting unit configured to select one of the internal clocks output from the delay locking units as an internal clock of the memory device.

DESCRIPTION OF SPECIFIC EMBODIMENTS

Hereinafter, a DLL circuit in accordance with the present invention will be described in detail with reference to the accompanying drawings.

Figure 1:
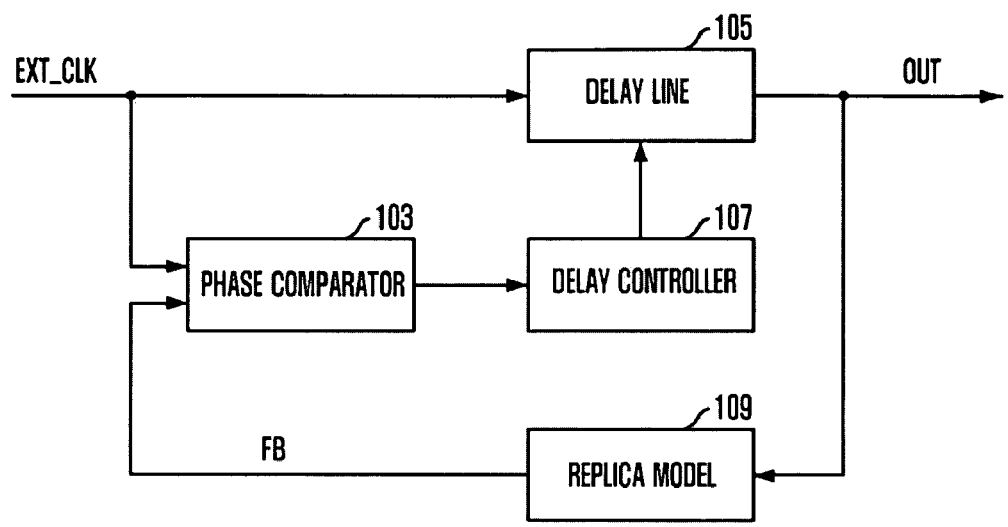
FIG. 1 is a block diagram of a conventional DLL circuit.
Figure 2:
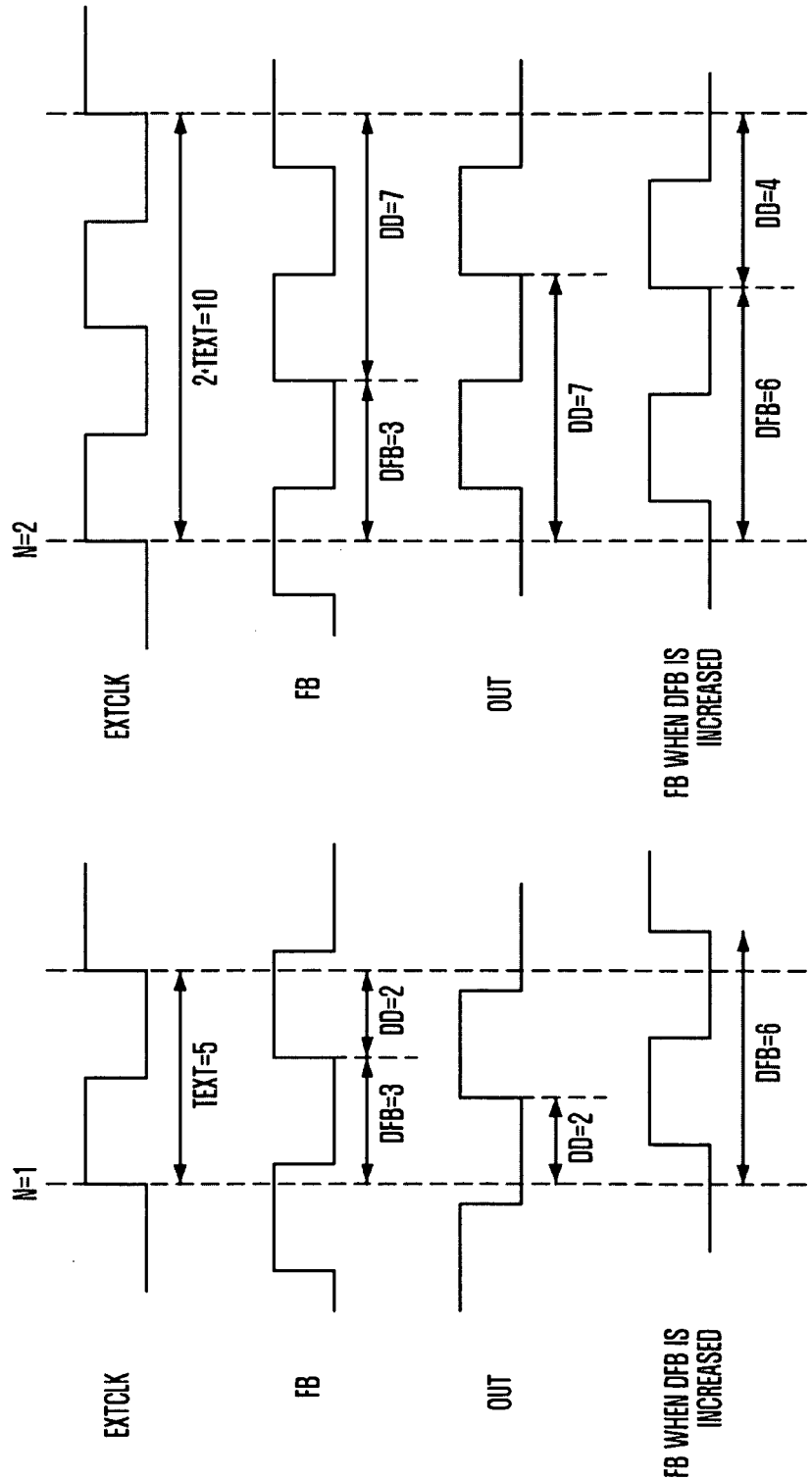
FIG. 2 is a timing diagram illustrating an amount of delay determined by a delay controller of FIG. 1.
Figure 3:
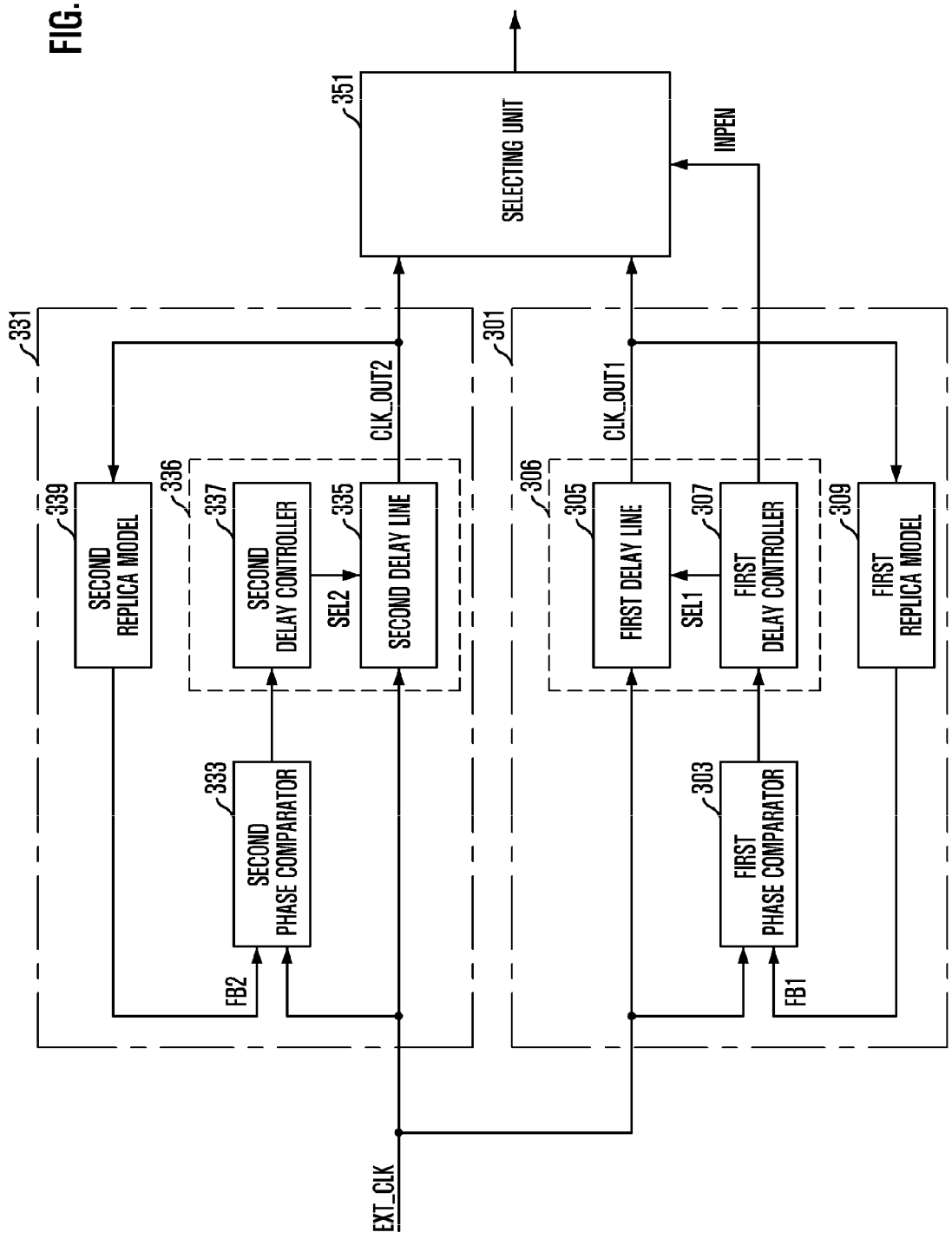
FIG. 3 is a block diagram of a DLL circuit in accordance with an embodiment of the present invention.

FIG. 3 is a block diagram of a DLL circuit in accordance with an embodiment of the invention.

Referring to FIG. 3, the DLL circuit for compensating for a phase skew of a memory device includes a first delay locking unit 301, a second delay locking unit 331, and a selecting unit 351. The first delay locking unit 301 delays an external clock EXT_CLK by a first amount of delay (DD_1) to output a first internal clock CLK_OUT1. The second delay locking unit 331 delays the external clock EXT_CLK by a second amount of delay (DD_2) to output a second internal clock CLK_OUT2, where the second amount of delay (DD_2) is greater than the first amount of delay (DD_1). The selecting unit 351 selects one of the first internal clock CLK_OUT1 and the second internal clock CLK_OUT2 and outputs the selected internal clock as a final internal clock of the memory device.

The first delay locking unit 301 includes a first phase comparator 303, a first delay unit 306, and a first replica model 309. The first phase comparator 303 compares a phase of the external clock EXT_CLK with a phase of a first feedback clock FB1 to calculate a first amount of delay (DD_1) of the external clock EXT_CLK. The first delay unit 306 outputs the first internal clock CLK_OUT1 according to the first amount of delay (DD_1). The first replica model 309 delays the first internal clock CLK_OUT1 according to a predetermined delay modeling to output the first feedback clock FB1.

The first delay unit 306 includes a first delay controller 307 configured to output a first delay control signal SEL1 delaying the external clock EXT_CLK according to the first amount of delay (DD_1), and a first delay line 305 configured to delay the external clock EXT_CLK according to the first delay control signal SEL1.

The second delay locking unit 331 includes a second phase comparator 333, a second delay unit 336, and a second replica model 339. The second phase comparator 333 compares a phase of the external clock EXT_CLK with a phase of a second feedback clock FB2 to calculate a second amount of delay (DD_2) of the external clock EXT_CLK. The second delay unit 336 outputs the second internal clock CLK_OUT2 according to the second amount of delay (DD_2). The second replica model 339 delays the second internal clock CLK_OUT2 according to a predetermined delay modeling to output the second feedback clock FB2.

The second delay unit 336 includes a second delay controller 337 configured to output a second delay control signal SEL2 delaying the external clock EXT_CLK according to the second amount of delay (DD_2), and a second delay line 335 configured to delay the external clock EXT_CLK according to the second delay control signal SEL2.

The first and second phase comparators 303 and 333 compares the phase of the external clock EXT_CLK with the phases of the first and second feedback clocks FB1 and FB2 fed back from the first and second replica models 309 and 339 to detect the phase differences therebetween. The first and second phase comparators 303 and 333 generate control signals SLE, SLO, SRE and SRO according to the detected phase differences. The first and second delay controllers 307 and 337 are implemented with shift registers and determines amount of delays DD_1 and DD_2, that is, a shift direction and a shift amount of the external clock EXT_CLK, based on the control signals SLE, SLO, SRE and SRO, to control the first and second delay lines 305 and 335 according to the determined amount of delays. The external clock EXT_CLK input to the first and second delay lines 305 and 335 are delayed according to the amount of delays determined by the first and second delay controllers 307 and 337. The first and second replica models 309 and 339 include modeled clock delay components of the internal paths of the memory device. The first and second replica models 309 and 339 delays the first and second internal clocks CLK_OUT1 and CLK_OUT2, which are the external clock EXT_CLK delayed by the first and second delay lines 305 and 335, according to the modeling, and outputs the first and second feedback clocks FB1 and FB2 to the first and second phase comparators 303 and 333.

Consequently, the amount of delays DD_1 and DD_2 of the external clocks EXT_CLK delayed by the first and second delay lines 305 and 335, that is, the first and second internal clocks CLK_OUT1 and CLK_OUT2, are locked so that the phases of the first and second internal clocks CLK_OUT1 and CLK_OUT2 coincide with the phase of the external clock EXT_CLK due to the internal delay of the memory device. The locked first and second internal clocks CLK_OUT1 and CLK_OUT2 are used as the internal clocks in the memory device.

The selecting unit 351 selects one of the first and second internal clocks CLK_OUT1 and CLK_OUT2 output from the first and second delay lines 305 and 335 according to the selection signal INPEN output from the first delay controller 307. For example, the selecting unit 351 selects the first internal clock CLK_OUT1, which is output from the first delay line 305, as a default. The selecting unit 351 may select the second internal clock CLK_OUT2, which is output from the second delay line 335, according to the selection signal INPEN.

Meanwhile, the first amount of delay DD_1 is different from the second amount of delay DD_2. That is, the value of N in Equation 1 is differently set in the first delay locking unit 301 and the second delay locking unit 331. For example, the value of N is set to 1 in the first delay locking unit 301, and the value of N is set to 2 in the second delay locking unit 331. FIG. 3 illustrates a case where the first amount of delay DD_1 is less than the second amount of delay DD_2.

As the amount of delays DFB of the first and second feedback clocks FB1 and FB2 output from the first and second replica models 309 and 339 increase, the first and second amount of delays DD_1 and DD_2 gradually decrease. If the amount of delays DFB of the first and second feedback clocks FB1 and FB2 gradually increase and thus the first amount of delay DD_1 cannot decrease any more, the first internal clock CLK_OUT1 cannot be locked. In this case, the first delay controller 307 enables the selection signal INPEN.

Since the second amount of delay DD_2 is greater than the first amount of delay DD_1, the second internal clock CLK_OUT2 can be locked even though the first internal clock CLK_OUT1 is not locked.

Therefore, when the first amount of delay DD_1 cannot decrease any more, that is, the first delay locking unit 301 cannot compensate for a skew between the internal clock and the external clock EXT_CLK, the selecting unit 351 selects the second internal clock CLK_OUT2, which is output from the second delay line 335, in response to the selection signal INPEN output from the first delay controller 307. In this way, the DLL circuit can output the locked signal.

As described above, the second internal clock CLK_OUT2 can be locked even though the first internal clock CLK_OUT1 is not locked because of the increase of the amount of delays DFB of the first and second feedback clocks FB1 and FB2 output from the first and second replica models 309 and 339. Therefore, the DLL circuit can output the locked signal even though the amount of delays DFB of the first and second feedback clocks FB1 and FB2 output from the first and second replica models 309 and 339 increase. Furthermore, since the first amount of delay DD_1 is less than the second amount of delay DD_2, the first internal clock CLK_OUT1 having a short locking time is output when the amount of delays DFB of the first and second feedback clocks FB1 and FB2 is small. Therefore, unnecessary time in the locking can be removed and jitters can be eliminated.

Meanwhile, the first delay line 305 and the second delay line 335 may be shared, which will be described later.

Figure 4:
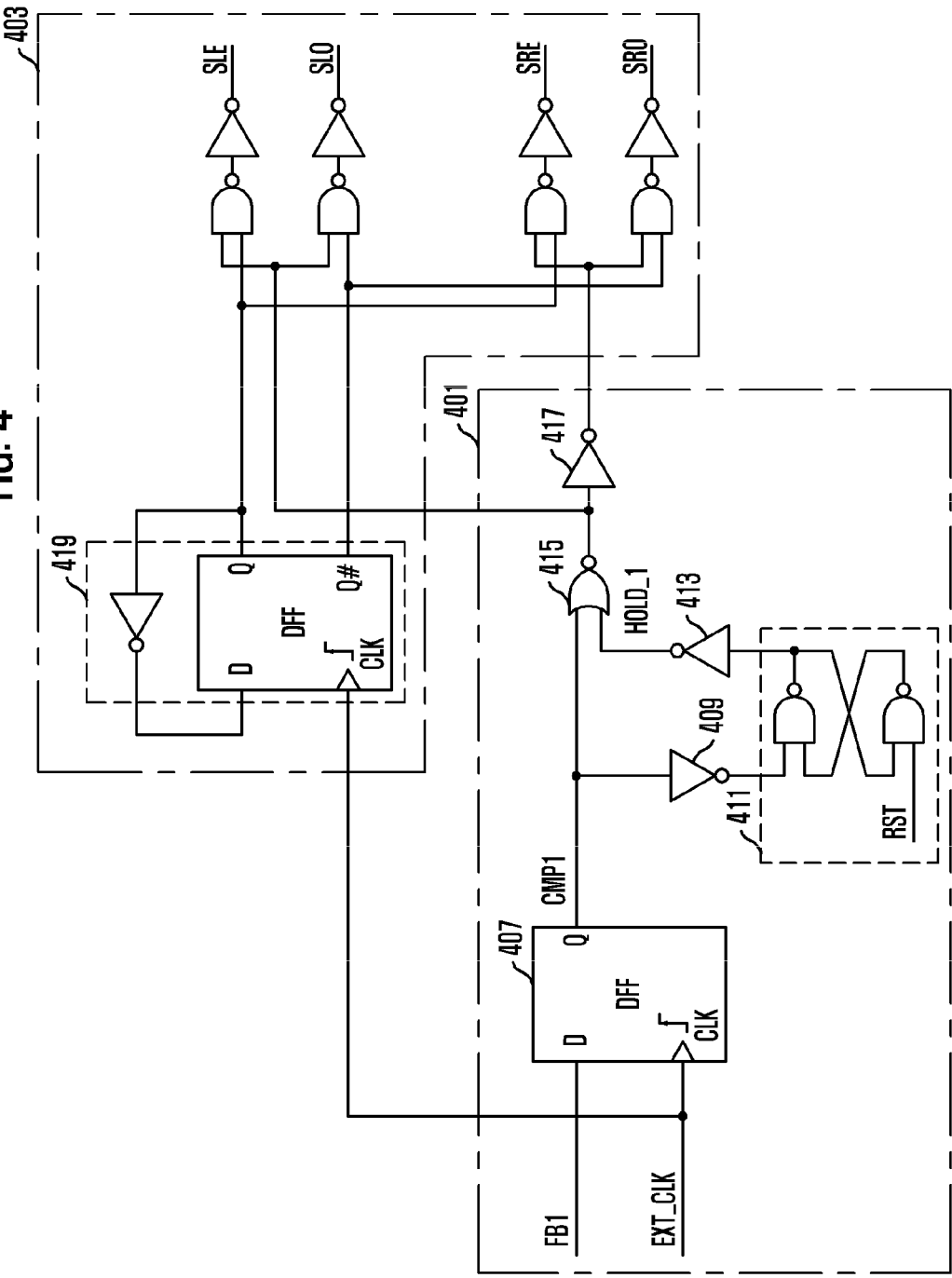
FIG. 4 is a circuit diagram of a first phase comparator of FIG. 3.

FIG. 4 is a circuit diagram of the first phase comparator 303 of FIG. 3.

Referring to FIG. 4, the first phase comparator 303 includes a phase detector 401 configured to compare a phase of the external clock EXT_CLK with a phase of the first feedback clock FB1, and a controller 403 configured to generator the control signals SLE, SLO, SRE and SRO to the first delay controller 307.

The second phase comparator 333 has the same structure as the first phase comparator 303. The following description is focusing on the first phase comparator 303.

When the first feedback clock FB1 is at a low level at the rising edge of the external clock EXT_CLK, that is, a phase offset occurs, an output signal CMP1 of a flip-flop 407 of the phase detector 401 becomes a low level. The output signal CMP1 of the flip-flop 407 is inverted to a high level through an inverter 409 and then input to a latch 411 together with a reset signal RST. An initial reset signal RST changes from a low level to a high level. A low-level output signal of the latch 411 passes through an inverter 413 and a first hold signal HOLD_1 becomes a high level. An output signal of a NOR gate 415 becomes a low level and then passes through an inverter 417. Therefore, an output signal of the phase detector 401 becomes a high level.

The controller 403 includes a pulse generator 419, a plurality of NAND gates, and a plurality of inverters. The pulse generator 419 receives the external clock EXT_CLK to generate two pulses having two times the period of the external clock EXT_CLK and a 180-degree phase difference. The flip-flop 407 of the phase detector 401 triggers a signal only at the rising edges. Therefore, the flip-flop 407 is used to allow the pulse generator 419 to maintain the control signals SLE, SLO, SRE and SRO from the rising edge to a next rising edge. The two pulses are input to SLE and SRE signal output terminals and SLO and SRO signal output terminals.

In addition, the controller 403 receives the output signal of the phase detector 401 through the SRE and SRO signal output terminals, and its inverted signal through the SLE and SLO signal output terminals. Therefore, the controller 403 outputs the signals SRE and SRO when the output signal of the phase detector 401 is at a high level, and outputs the signals SLO and SLE when the output signal of the phase detector 401 is at a low level.

In this case, since the output signal of the phase detector 401 is at a high level and input to the SRE and SRO signal output terminals, the controller 403 outputs the signals SRE and SRO for increasing the first amount of delay DD_1. At an early stage, the shift registers of the first and second delay controllers 307 and 337 increase the first amount of delay DD_1 because the first amount of delay DD_1 is in a state of 0. If the external clock EXT_CLK is continuously delayed, the first feedback clock FB1 becomes a high level at the rising edge of the external clock EXT_CLK.

The output signal CMP1 of the flip-flop 407 of the phase detector 401 is at a low level. The output signal CMP1 of the flip-flop 407 is inverted to a high level through the inverter 409 and then input to the latch 411. The reset signal RST is at a high level, and passes through the inverter 413. Thus, the hold signal HOLD_1 becomes a low level. The hold signal HOLD_1 passes through the NOR gate 415 and the inverter 417 so that the output signal of the phase detector 401 becomes a high level. The controller 403 outputs the signals SRE and SRO to increase the first amount of delay DD_1.

Consequently, the first feedback clock FB1 again becomes a low level at the rising edge of the external clock EXT_CLK. Unlike the previous low level case, since the first hold signal HOLD_1 is at a low level, the output signal of the phase detector 401 becomes a low level and the signals SLE and SLO are output to decrease the first amount of delay DD_1. Thereafter, the output signal of the phase detector 401 again becomes a high level to increase the first amount of delay DD_1, and then becomes a low level to decrease the first amount of delay DD_1. That is, the phase detector 401 alternately outputs the high level signal and the low level signal. At this point, it can be considered that the locking is achieved. This is because the amount of delay DD cannot be continuous due to characteristic of a digital circuit.

Figure 5:
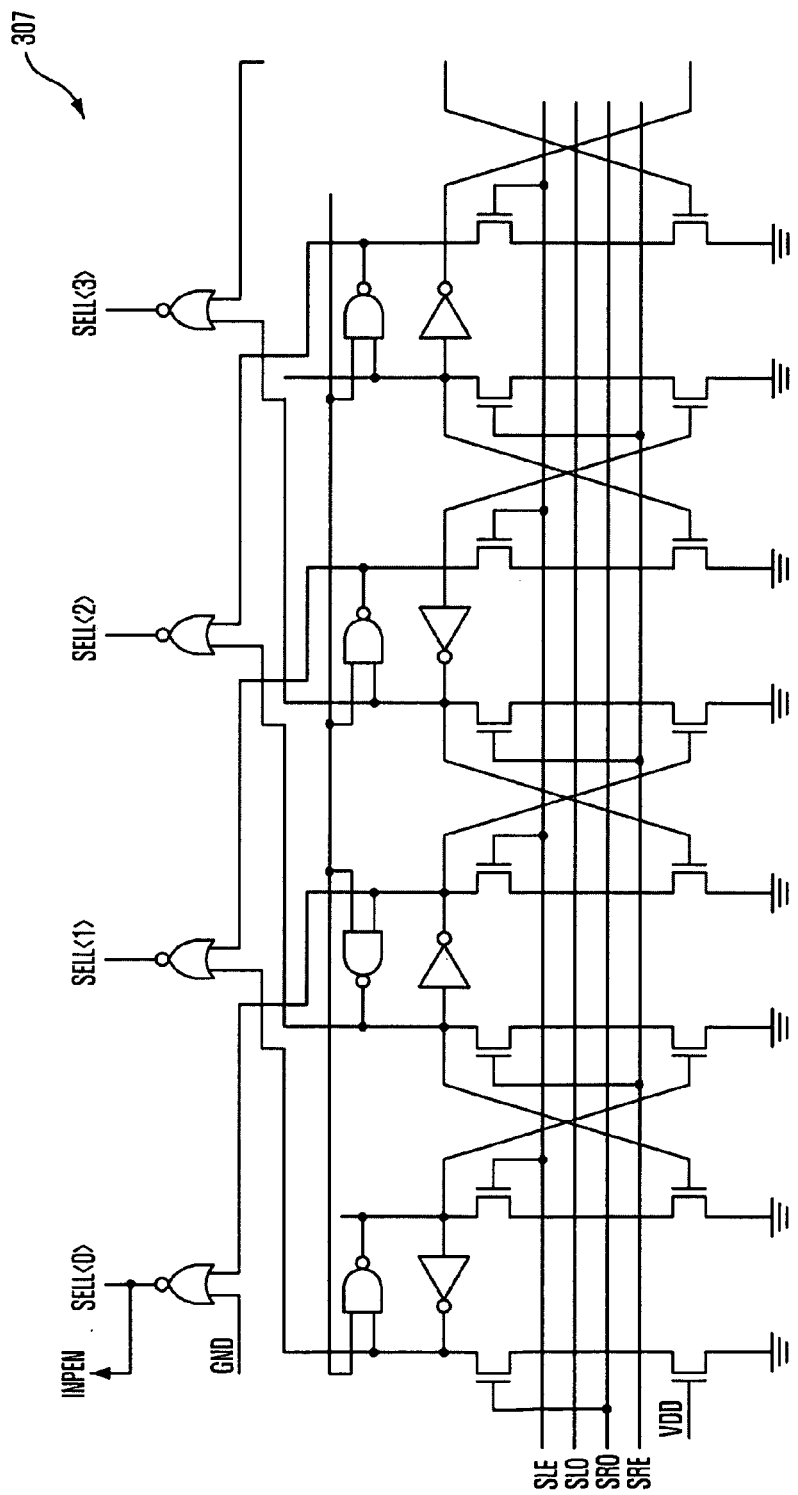
FIG. 5 is a circuit diagram of a first delay controller of FIG. 3.

FIG. 5 is a circuit diagram of the first delay controller 307 of FIG. 3.

The first delay controller 307 is implemented with a shift register. The second delay controller 337 has the same structure as the first delay controller 307 except that the first delay controller 307 enables the selection signal INPEN. The following description is focusing on the first delay controller 307.

The first delay controller 307 is controlled by the control signals SLE, SLO, SRE and SRO output from the controller 403. The delay control signal SEL1 of the first delay controller 307 is transferred to the first delay line 305 to control the first amount of delay DD_1 of the first delay line 305.

The control signal SLE is generated in synchronization with even-numbered rising edges of the external clock EXT_CLK and shifts the data of the shift register to the left. The control signal SRE is generated in synchronization with odd-numbered rising edges of the external clock EXT_CLK and shifts the data of the shift register to the left. The control signal SRE is generated in synchronization with even-numbered rising edges of the external clock EXT_CLK and shifts the data of the shift register to the right. The control signal SRO is generated in synchronization with odd-numbered rising edges of the external clock EXT_CLK and shifts the data of the shift register to the right.

That is, the first delay controller 307 shifts the first delay control signal SEL1 to the right in order to increase the first amount of delay DD_1, and shifts the first delay control signal SEL1 to the left in order to decrease the first amount of delay DD_1. When the first amount of delay DD_1 cannot be decreased any more, that is, the first delay control signal SEL1 is shifted to the leftmost (a signal SEL1[0] is output), the first delay locking unit 301 cannot achieve the locking. The first delay controller 307 activates the first delay control signal SEL1 and transfers it as the selection signal INPEN to the selecting unit 405. When the first amount of delay DD_1 cannot decrease any more, the selection signal INPEN maintains the enabled state and the selecting unit 405 outputs the second internal clock CLK_OUT2 in response to the selection signal INPEN.

Figure 6:
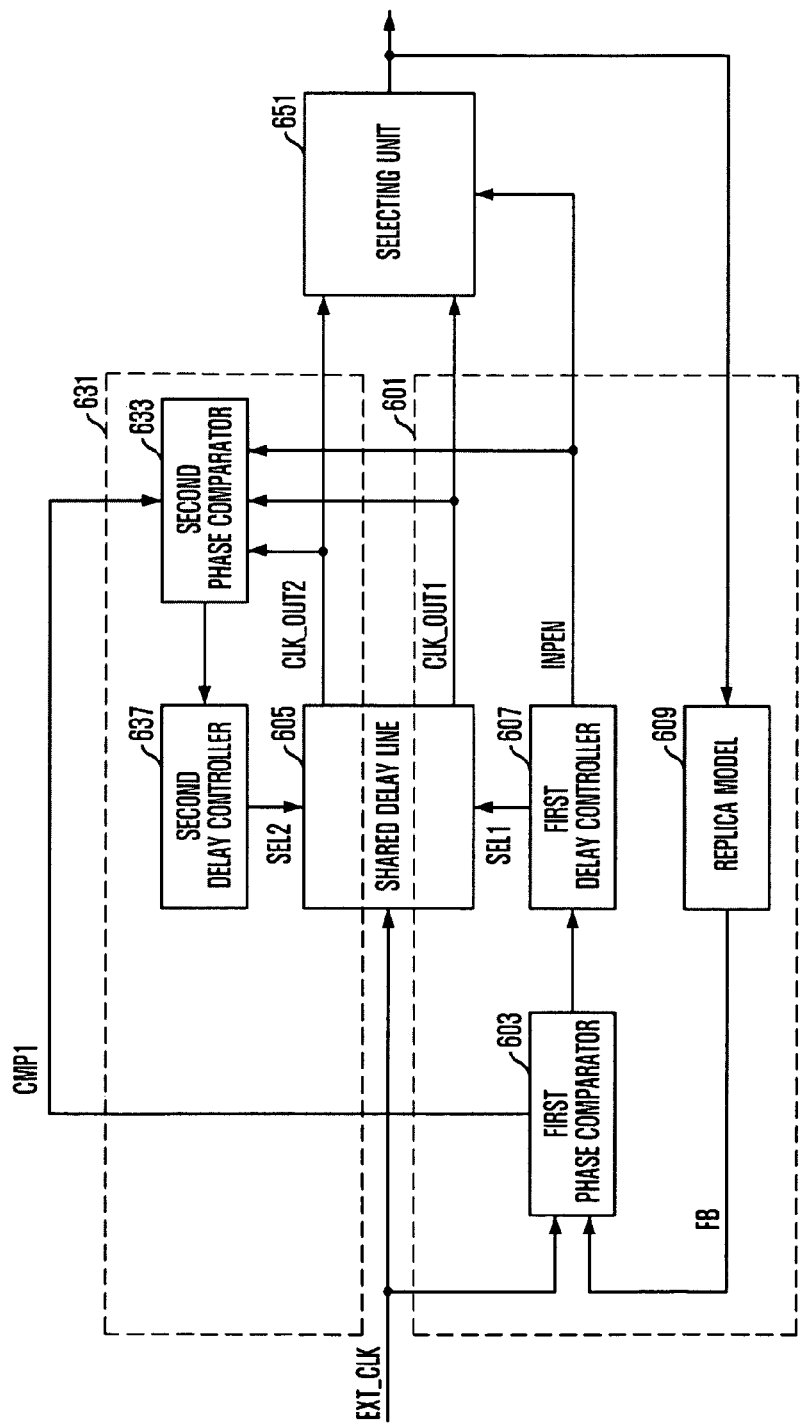
FIG. 6 is a block diagram of a DLL circuit in accordance with another embodiment of the invention.

FIG. 6 is a block diagram of a DLL circuit in accordance with another embodiment of the invention.

Referring to FIG. 6, the DLL circuit for compensating for a phase skew of a memory device includes a first delay locking unit 601, a second delay locking unit 631, and a selecting unit 651. The first delay locking unit 601 delays an external clock EXT_CLK by a first amount of delay DD_1 to output a first internal clock CLK_OUT1. The second delay locking unit 631 delays the external clock EXT_CLK by a second amount of delay DD_2 according to the phase comparison result of the first internal clock CLK_OUT1 and a second internal clock CLK_OUT2 to output the second internal clock CLK_OUT2, where the second amount of delay DD_2 is greater than the first amount of delay DD_1. The selecting unit 651 selects one of the first internal clock CLK_OUT1 and the second internal clock CLK_OUT2 and outputs the selected internal clock as a final internal clock of the memory device.

Unlike the embodiment of FIG. 3, the first delay locking unit 601 and the second delay locking unit 631 share one shared delay line 605. The shared delay line 605 is an element corresponding to the first and second delay lines 305 and 335 of FIG. 3. In accordance with the current embodiment of the invention, a chip area is reduced compared with the case where the first and second delay locking units 301 and 331 include the first and second delay lines 305 and 335. The shard delay line 605 receives one external clock EXT_CLK to output the first internal clock CLK_OUT1 and the second internal clock CLK_OUT2.

The external clock EXT_CLK is input to the first delay locking unit 601 and the shared delay line 605. The selecting unit 651 selects the first internal clock CLK_OUT1, which is output from the first delay locking unit 601, as a default. Also, the selecting unit 651 may select the second internal clock CLK_OUT2 output from the second delay locking unit 631. The first and second internal clocks CLK_OUT1 and CLK_OUT2 will be described later.

The first delay locking unit 601 and the second delay locking unit 631 include first and second delay controllers 607 and 637, respectively. The first and second delay controllers have the same structure as the first and second delay controllers 307 and 337 of FIG. 3.

The first delay locking unit 601 further includes a first phase comparator 603 and a replica model 609. The first phase comparator 603 has the same structure as the first and second phase comparators 303 and 333 of FIG. 3, and the replica model 609 has the same structure as the first and second replica models 309 and 339 of FIG. 3.

The second delay locking unit 631 further includes a second phase comparator 633. The second phase comparator 633 receives the first internal clock CLK_OUT1 to calculate a second amount of delay DD_2 of the external clock EXT_CLK by comparing a phase of the second internal clock CLK_OUT2 with a phase of a delayed second internal clock.

The shared delay line 605 outputs the first and second internal clocks CLK_OUT1 and CLK_OUT2 delayed by the first and second amount of delays DD_1 and DD_2 under control of the first and second delay controllers 607 and 637 of the first and second delay locking units 601 and 637.

In the embodiment of FIG. 6, the first amount of delay DD_1 is less than the second amount of delay DD_2.

Like in the embodiment of FIG. 3, if the amount of delay DFB of the feedback clock FB output from the replica model 609 continuously increases and thus the first amount of delay DD_1 cannot decrease any more, the first internal clock CLK_OUT1 cannot be locked. In this case, the first delay controller 607 of the first delay locking unit 601 enables the selection signal INPEN.

Meanwhile, the second delay locking unit 631 has the second amount of delay DD_2 greater than the first amount of delay DD_1, based on the first internal clock CLK_OUT1 of the first delay locking unit 601. This is because while comparing a phase of the second internal clock CLK_OUT2 with a phase of the first internal clock CLK_OUT1, not the external clock EXT_CLK, the second delay locking unit 631 delays the second internal clock CLK_OUT2 so that the first internal clock CLK_OUT1 and the second internal clock CLK_OUT2 have a phase difference, and compares the phase of the first internal clock CLK_OUT1 with the phase of the second internal clock CLK_OUT2.

More specifically, although the phase of the first internal clock CLK_OUT1 is identical to that of the second internal clock CLK_OUT2, the second delay locking unit 631 performs a phase comparison by delaying the second internal clock CLK_OUT2, and thus there occurs a phase difference between the first internal clock CLK_OUT1 and the second internal clock CLK_OUT2. Therefore, during the locking of the first internal clock CLK_OUT1, the second amount of delay DD_2 has the same amount of delay DD as the first amount of delay DD_1.

After the locking of the first internal clock CLK_OUT1, the first internal clock CLK_OUT1 is not delayed. However, since the second delay locking unit 631 receives the delayed second internal clock CLK_OUT2 having the same amount of delay DD as the first internal clock CLK_OUT1, the second amount of delay DD_2 is greater than the first amount of delay DD_1 due to the phase difference.

Meanwhile, since the second amount of delay DD_2 is greater than the first amount of delay DD_1, the second amount of delay DD_2 can decrease even when the first amount of delay DD_1 cannot further decrease any more. Therefore, the locked state of the second delay locking unit 631 is maintained. When the first amount of delay DD_1 cannot further decrease any more, the selecting unit 651 selects and outputs the second internal clock CLK_OUT2 in response to the selection signal INPEN. The second internal clock CLK_OUT2 output from the selecting unit 651 is fed back to the first phase comparator 603 through the replica model 607.

That is, even though the first internal clock CLK_OUT1 is not locked, the first phase comparator 603 receives the signal fed back from the second internal clock CLK_OUT2, not the first internal clock CLK_OUT1. Thus, the second amount of delay DD_2 may decrease at the second delay locking unit 601. Further detailed description will be made later.

Consequently, the selecting unit 651 selects and outputs the second internal clock CLK_OUT2 of the clock signals CLK_OUT1 and CLK_OUT2 output from the shared delay line 605, based on the selection signal INPEN output from the first delay controller 607. Therefore, the DLL circuit can output the locked signal.

Meanwhile, the second delay locking unit 631 delays the external clock EXT_CLK, based on the first and second internal clocks CLK_OUT1 and CLK_OUT2 output from the shared delay line 605. The amount of delay DFB of the feedback clock FB output from the replica model 609 has been already reflected on the first internal clock CLK_OUT1. Therefore, unlike the first delay locking unit 601, the chip area is reduced because the second delay locking unit 631 does not include the replica model.

Figure 7:
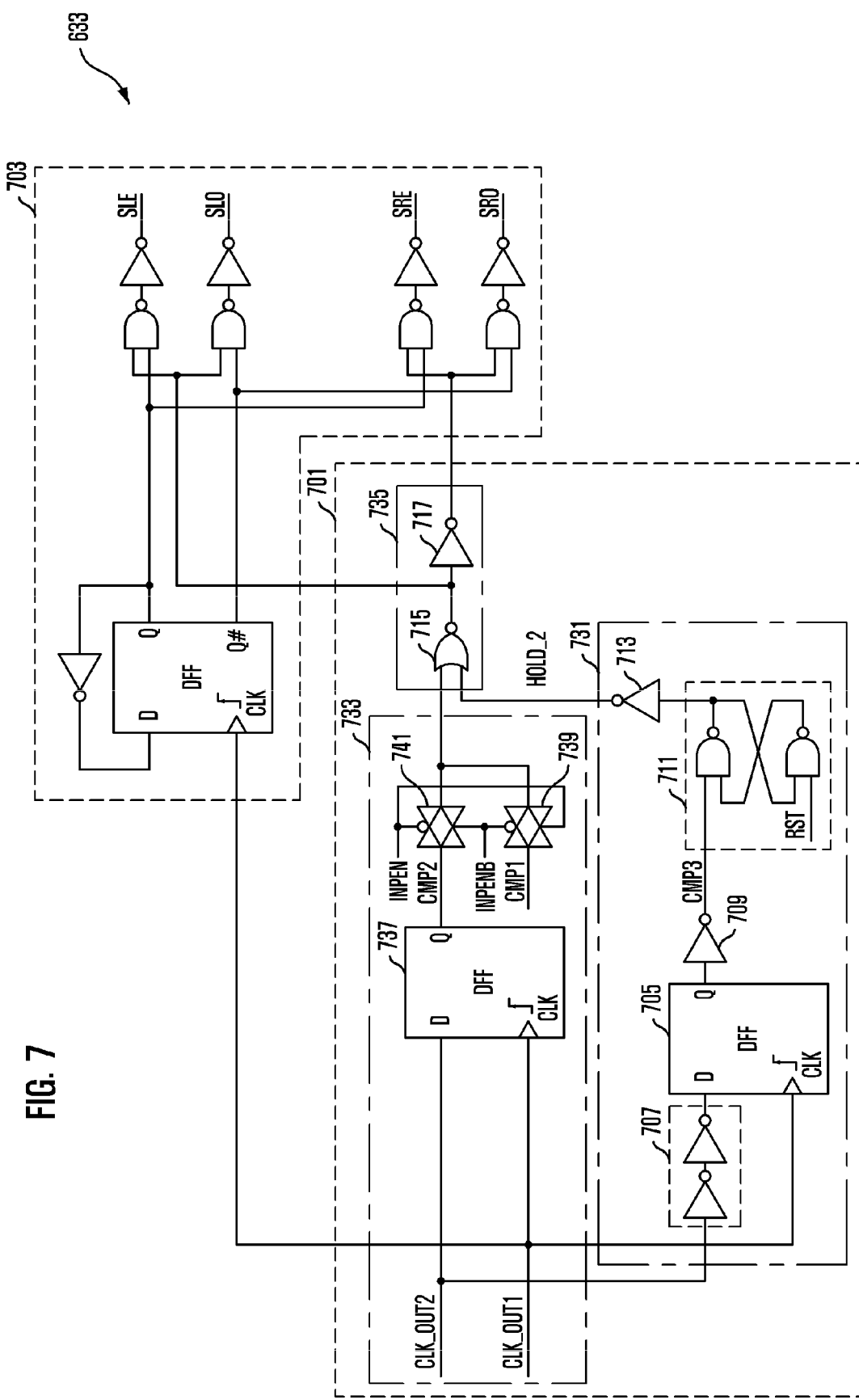
FIG. 7 is a circuit diagram of a second phase comparator of FIG. 6.

FIG. 7 is a circuit diagram of the second phase comparator 633 of FIG. 6.

Referring to FIG. 7, the second phase comparator 633 includes a phase detector 701 configured to compare a phase of the first internal clock CLK_OUT1 with a phase of the second internal clock CLK_OUT2, and a controller 703 configured to generate control signals SLE, SLO, SRE and SRO to the second delay controller 637.

The controller 703 of FIG. 7 has the same structure as the controller 403 of FIG. 4.

In order to make the second amount of delay DD_2 be greater than the first amount of delay DD_1, the phase detector 701 includes a first comparison unit 731, a second comparison unit 733, and an OR gate unit 735. The first comparison unit 731 compares a phase of the delayed second internal clock CLK_OUT2 with a phase of the first internal clock CLK_OUT2. The second comparison unit 733 compares a phase of the second internal clock CLK_OUT2 with a phase of the first internal clock CLK_OUT1 when the selection signal INPEN is disabled, and compares a phase of the external clock EXT_CLK with a phase of the feedback clock FB when the selection signal INPEN is enabled. The OR gate unit 735 performs an OR operation on the comparison results of the first and second comparison units 731 and 733 and outputs the OR operation result to the controller 703.

The first comparison unit 731 includes a delay 707, a flip-flop 705, and a latch 711. The delay 731 delays the second internal clock CLK_OUT2, and the flip-flop 705 triggers the second internal clock CLK_OUT2 delayed at the rising edge of the first internal clock CLK_OUT1. The latch 711 latches an output signal of the flip-flop 705. The second comparison unit 733 includes a flip-flop 737 and a plurality of pass gates 739 and 741. The flip-flop 737 triggers the second internal clock CLK_OUT2 at the rising edge of the first internal clock CLK_OUT1. The plurality of pass gates 739 and 741 pass the output signal of the flip-flop 705 when the selection signal INPEN is disabled, and pass the output signal CMP1 of the first phase comparator 603 when the selection signal INPEN is enabled.

Since the first comparison unit 731 receives the delayed second internal clock CLK_OUT2 and triggers the second internal clock CLK_OUT2 at the rising edge of the first internal clock CLK_OUT1, the output level of the flip-flop 705 becomes a low level. At this point, in order to make the second amount of delay DD_2 be greater than the first amount of delay DD_1, the delay unit 707 has only to have a delay degree at which the phase of the first internal clock CLK_OUT1 is offset from the phase of the second internal clock CLK_OUT2.

The low level signal is inverted by the inverter 709 and input to the latch 711 together with the reset signal RST. Since the initial reset signal RST has a low level and the latch 711 stores a high level as a previous value, the output level of the latch 711 becomes low. The output signal of the latch 711 passes through the inverter 713, so that the second hold signal HOLD_2 becomes a high level. Since the high level signal is input to the NOR gate 715, the controller 703 generates the SRE and SRO control signals for increasing the second amount of delay DD_2, regardless of the output signal CMP2 of the flip-flop 737 of the second comparison unit 733.

The first delay locking unit 601 outputs the first internal clock CLK_OUT1 by delaying the external clock EXT_CLK until the first internal clock CLK_OUT1 is locked. The second internal clock CLK_OUT2 is further delayed than the first internal clock CLK_OUT1 by the delay unit 707 and then input to the flip-flop 705. Therefore, the second amount of delay DD_2 has the same amount of delay DD as the first amount of delay DD_1 while the first delay locking unit 601 is locked.

Thereafter, when the first internal clock CLK_OUT1 is locked, the first internal clock CLK_OUT1 is not delayed any more. However, the second internal clock CLK_OUT2 is delayed even after the first internal clock CLK_OUT1 is locked. If the second internal clock CLK_OUT2 has a 180-degree phase difference from the first internal clock CLK_OUT1, the output level of the flip-flop 705 becomes a high level. Since the high level signal and the reset signal of the high level are input to the latch 711, the latch 711 outputs a high level signal. The high level signal is inverted by the inverter 713 and thus the second hold signal HOLD_2 of a low level is output. Therefore, the second amount of delay DD_2 does not increase any more by the first comparison unit 731.

In this case, since the output signal CMP2 of the flip-flop 737 of the second comparison unit 733 also has a high level and the selection signal INPEN is disabled to a low level, the pass gate 741 of the second comparison unit 733 is turned on and the second comparison unit 733 outputs the signal CMP2. Therefore, even though the second hold signal HOLD_2 is at a low level, the phase detector 701 outputs a high level signal due to the NOR gate 715 and the inverter 717 included in the OR gate unit 735, and the controller 703 outputs the SRE and SRO control signals for increasing the second amount of delay DD_2.

Thereafter, the second internal clock CLK_OUT2 is continuously delayed, and the flip-flop 705 of the first comparator 731 again outputs a low level signal when the phase difference between the second internal clock CLK_OUT2 and the first internal clock CLK_OUT1 is one period. The low level signal is changed to a high level signal by the inverter 709, and the high level signal is input to the latch 711. Since the reset signal RST is also at a high level, the latch 711 outputs the previous value, that is, the high level. Therefore, the second hold signal HOLD_2 has a low level. Since the output signal CMP2 of the flip-flop 737 of the second comparison unit 733 also has a low level, the controller 703 outputs the SLE and SLO control signals decreasing the second amount of delay DD_2.

Like the phase detector 401 of FIG. 4, the phase detector 701 alternately outputs the high level signal and the low level signal. At this point, the second internal clock CLK_OUT2 can be considered to be locked. That is, it can be seen that the second internal clock CLK_OUT2 is locked with the second amount of delay DD_2, which is greater than the first amount of delay DD_1 by one period of the external clock EXT_CLK.

A case where the first amount of delay DD_1 cannot further decrease at the first delay locking unit 601 will be described below.

This case is a case where the first internal clock CLK_OUT1 cannot be locked. The selection signal INPEN is enabled to a high level. Therefore, the pass gate 739 of the second comparison unit 733 is turned on so that the second comparison unit 733 outputs the output signal CMP1 of the first phase comparator 603. Since the electing unit 651 outputs the second internal clock CLK_OUT2, the first phase comparator 603 compares the phase of the external clock EXT_CLK with the phase of the feedback clock FB fed back from the second internal clock CLK_OUT2. In addition, the second internal clock CLK_OUT2 can be locked because the second phase comparator 633 receives the output signal CMP1 of the first phase comparator 603 even though the first internal clock CLK_OUT1 cannot be locked.

Figure 8:
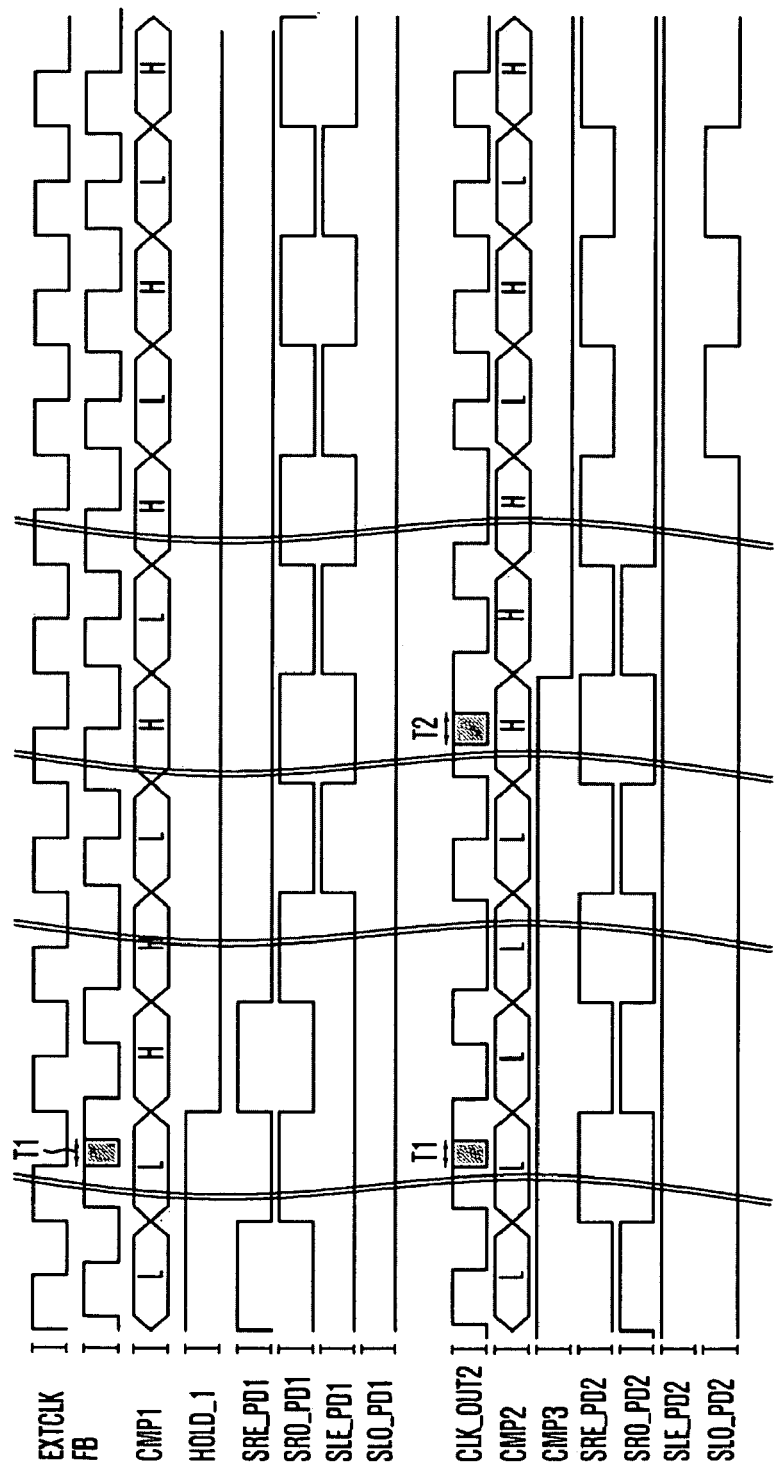
FIG. 8 is a timing diagram illustrating the operation of the DLL circuit in accordance with the embodiment of the invention.

FIG. 8 is a timing diagram illustrating the operation of the DLL circuit in accordance with the embodiment of the invention.

In the early stage, the feedback clock FB is further delayed than the external clock EXT_CLK. In spite that the locking is easy because the first delay locking unit 601 decreases the first amount of delay DD_1, the first amount of delay DD_1 of the shared delay line 605 is zero at the early stage. Thus, the locking must be achieved after increasing the first amount of delay DD_1 to some degree.

Since the first hold signal HOLD_1 is at a high level, the first phase comparator 603 outputs the SRE and SRO signals for increasing the first amount of delay DD_1. If the feedback clock FB is delayed and its phase coincides with the phase of the external clock EXT_CLK, the first phase comparator 603 alternately outputs the SRO signal for increasing the first amount of delay DD_1 and the SLE signal for decreasing the first amount of delay DD_1. As described above, the locking is achieved at the first locking unit 601 because the amount of delay DD cannot be continuously changed in the digital circuit and the first amount of delay DD_1 is increased by t1.

As the first amount of delay DD_1 is increased at the first delay locking unit 601, the amount of delay DD_2 of the second internal clock CLK_OUT2 is increased at the second delay locking unit 631 by the SRE and SRO signals that increase the second amount of delay DD_2. For the easy understanding of the invention, the amount of delay DFB of the replica model 609 is additionally illustrated together with the feedback clock FB. The amount of delay DD of the second internal clock CLK_OUT2 is increased by the SRE and SRO signals even though the first amount of delay DD_1 is not increased after the locking of the first internal clock CLK_OUT1. Since the second phase comparator 631 receives the delayed second internal clock CLK_OUT2, the signal CMP3 is a high level, and the high level passing through the OR gate unit 735 enables the controller 703 to output the SRE and SRO signals.

The signal CMP3 becomes a low level when the second internal clock CLK_OUT2 is continuously delayed and the phase difference between the first internal clock CLK_OUT1 and the second internal clock CLK_OUT2 are more than 180 degrees. However, the second comparison unit 833 compares the phase of the first internal clock CLK_OUT1 with the phase of the second internal clock CLK_OUT2 and the signal CMP2 becomes a high level. Therefore, the high level passing through the OR gate unit 735 enables the controller 703 to output the SRE and SRO signals, and the second internal clock CLK_OUT2 further has the amount of delay DD as much as t2. The SRE and SLO signals are alternately output, thereby achieving the locking.

That is, the second amount of delay DD_2 is locked with the amount of delay DD of t1+t2, which is greater than the first amount of delay DD_1 by t1. In FIG. 8, t1 and t2 do not represent the accurate amount of delay DD, but it means that the second delay locking unit 631 is locked with the greater amount of delay DD than the first delay locking unit 601.

Figure 9:
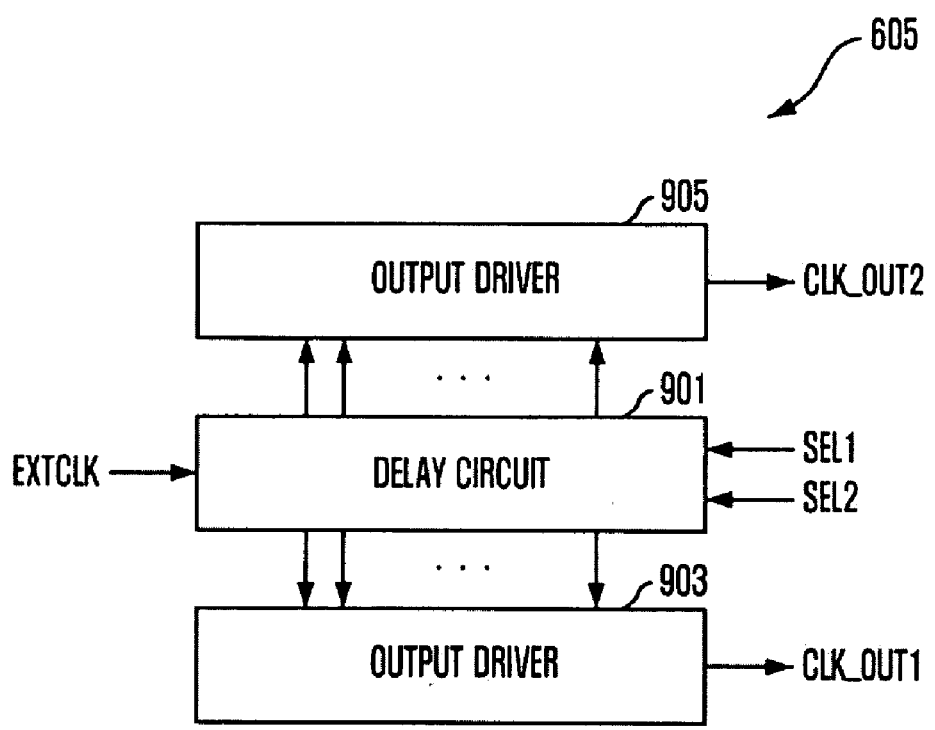
FIG. 9 is a block diagram of a shared delay line of FIG. 6.

FIG. 9 is a block diagram of the shared delay line 605 of FIG. 6. The shared delay line 605 includes a delay circuit 901 and output drivers 903 and 905. The delay circuit 901 includes a plurality of delay units connected in series to receive the external clock EXT_CLK through one input terminal to delay the external clock EXT_CLK in response to the first and second control delay signals SEL1 and SEL2. The output drivers 903 and 905 receive output signals of the delay circuit 901 to output them to the selecting unit 651.

The delay circuit 901 receives the first delay control signal SEL1 and the second delay control signal SEL2 to increase or decrease the first and second amount of delays DD_1 and DD_2. Also, the delay circuit 901 output the first and second internal clocks CLK_OUT1 and CLK_OUT2, that is, the external clock EXT_CLK delayed according to the first and second delay control signals SEL1 and SEL2, through the output drivers 903 and 905.

Since the first and second delay locking units 601 and 631 share the delay lines having the same function and structure are shared, the chip area can be reduced.

In addition, the first and second delay lines 305 and 335 of the DLL circuit of FIG. 3 can also be shared.

Figure 10:
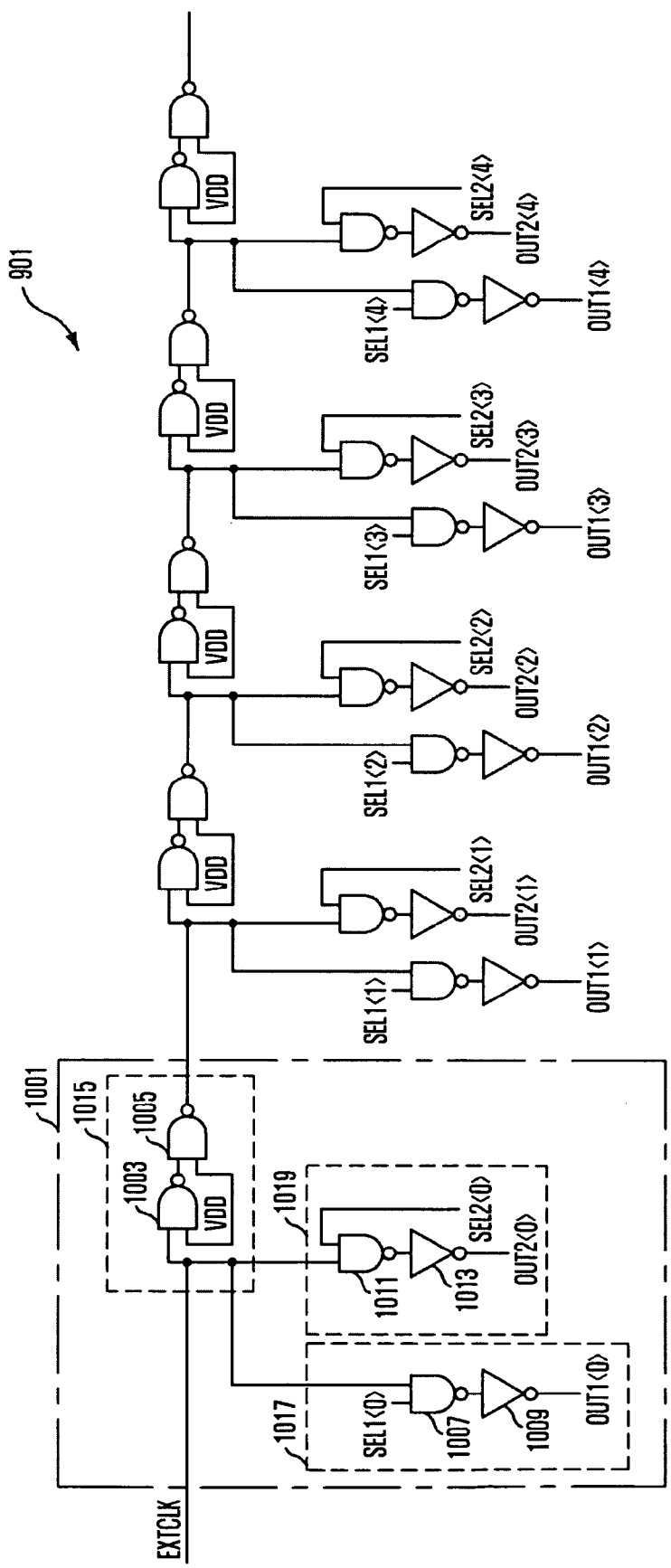
FIG. 10 is a circuit diagram of a delay circuit of FIG. 9.

FIG. 10 is a circuit diagram of the delay circuit 901 of FIG. 9.

The delay circuit 901 includes a plurality of delay units connected in series.

The delay unit includes a transfer unit 1015, a first delay unit 1017, and a second delay unit 1019. The transfer unit 1015 receives the external clock EXT_CLK and the power supply voltage VDD to transfer the external clock EXT_CLK to a next delay unit. The first delay unit 1017 outputs the first internal clock CLK_OUT1 in response to the first delay control signal SEL1. The second delay unit 1019 outputs the second internal clock CLK_OUT2 in response to the second delay control signal SEL2.

In the first delay unit 1101, the external clock EXT_CLK and the power supply voltage VDD are input to a first NAND gate 1003 of the transfer unit 1015. An output signal of the first NAND gate 1003 and the power supply voltage VDD are input to a second NAND gate 1005 of the transfer unit 1015, and an output signal of the second NAND gate 1005 is transferred to a next delay unit.

A third NAND gate 1007 of the first delay unit 1017 receives the external clock EXT_CLK and the first delay control signal SEL1, and an output signal of the third NAND gate 1007 is inverted by a first inverter 1009. A fourth NAND gate 1011 of the second delay unit 1019 receives the external clock EXT_CLK and the second delay control signal SEL2, and an output signal of the fourth NAND gate 1011 is inverted by an inverter 1013.

That is, since the third NAND gate 1007 and the fourth NAND gate 1011 output the signals according to the first and second delay control signals SEL1 and SEL2, the shared delay line 605 has two outputs.

For example, if the first delay control signal SEL1 is input to the third NAND gate 1007 of the fifth delay unit, the first internal clock CLK_OUT1 delayed through five delay units is output. If the second delay control signal SEL2 is input to the fourth NAND gate 1011 of the second delay unit, the second internal clock CLK_OUT2 delayed through two delay units is output.

Figure 11:
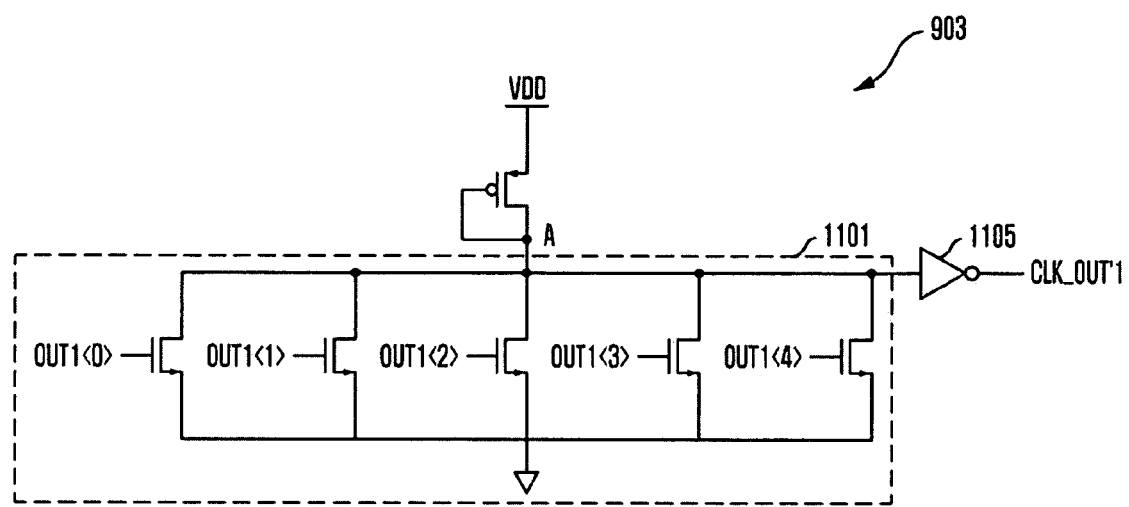
FIG. 11 is a circuit diagram of an output driver of FIG. 9.

FIG. 11 is a circuit diagram of the output driver 903 (905) of FIG. 9.

Referring to FIG. 11, the output driver 903 (905) includes a node A terminated to a first level, and a driver 1101 configured to drive the node A to a second level in response to the output signals of the first and second delay units 1017 and 1019.

A signal of a first level is output in response to the enable periods of the first and second internal clocks CLK_OUT1 and CLK_OUT2 delayed by the first and second delay units 1017 and 1019, and a signal of a second level is output in response to disable periods of the first and second internal clocks CLK_OUT1 and CLK_OUT2 delayed by the first and second delay units 1017 and 1019.

The output driver 905 receiving the output signal of the second delay unit 1019 has the same structure as the output driver 903 receiving the output signal of the first delay unit 1017.

The following description will be focusing on the output driver 903 receiving the output signal of the first delay unit 1017.

The output signals of the first delay unit 1017 are input to the driver 1101 of the output driver 903. Transistors of the driver 1101 are turned on/off in response to the first internal clock CLK_OUT1. When the first internal clock CLK_OUT1 is disabled to a low level, the transistors of the driver 1101 are not turned on and the node A is terminated to a high level due to the power supply voltage VDD. When the first internal clock CLK_OUT1 is enabled to a high level, the transistors of the driver 1101 are turned on and the node A is driven to a low level.

The logic level of the node A is output as the first internal clock CLK_OUT1 through the inverter 1105.

Meanwhile, it is apparent to those skilled in the art that a plurality of delay locking units may be provided in the DLL circuit.

In accordance with the embodiments of the invention, the locking can be achieved even though the amount of delay DFB of the feedback clock FB increases. The locking can be achieved without unnecessary time loss and jitters.

While the invention has been described with respect to the specific embodiments, it will be apparent to those skilled in the art that various changes and modifications may be made without departing from the spirit and scope of the invention as defined in the following claims.

What is claimed is:

1. A delay locked loop circuit for compensating for a phase skew of a memory device, comprising:
   a first delay locking unit configured to delay an external clock of the memory device by a first amount of delay to output a first internal clock;
   a second delay locking unit configured to delay the external clock by a second amount of delay to output a second internal clock, the second amount of delay being greater than the first amount of delay; and
   a selecting unit configured to select one of the first internal clock and the second internal clock as an internal clock of the memory device, wherein the selecting unit selects the second internal clock when the first delay locking unit cannot compensate for the phase skew.

2. The delay locked loop circuit as recited in claim 1, wherein the first delay locking unit includes
   a first phase comparator configured to compare a phase of the external clock with a phase of a first feedback clock to calculate the first amount of delay of the external clock,
   a first delay unit configured to output the first internal clock according to the first amount of delay, and
   a first replica model configured to delay the first internal clock by a predetermined delay modeling to output the first feedback clock.

3. The delay locked loop circuit as recited in claim 2, wherein the first delay unit enables a selection signal when the first amount of delay cannot be reduced, and the selecting unit selects the second internal clock in response to the selection signal.

4. The delay locked loop circuit as recited in claim 1, wherein the second delay locking unit includes
   a second phase comparator configured to compare a phase of the external clock with a phase of a second feedback clock to calculate the second amount of delay of the external clock,
   a second delay unit configured to output the second internal clock according to the second amount of delay, and
   a second replica model configured to delay the second internal clock according to a predetermined delay modeling to output the second feedback clock.

5. The delay locked loop circuit as recited in claim 1, wherein the first delay locking unit includes
   a first phase comparator configured to compare a phase of the external clock with a phase of a first feedback clock to calculate the first amount of delay of the external clock,
   a first delay controller configured to output a first delay control signal for delaying the external clock according to the first amount of delay, and
   a first replica model configured to delay the first internal clock, output from a shared delay line, according to a predetermined delay modeling to output the first feedback clock,
   the second delay locking unit including
      a second phase comparator configured to compare a phase of the external clock with a phase of a second feedback clock to calculate the second amount of delay of the external clock,
      a second delay controller configured to output a second delay control signal for delaying the external clock according to the second amount of delay, and
      a second replica model configured to delay the second internal clock, output from the shared delay line, according to a predetermined delay modeling to output the second feedback clock, and
   the first delay locking unit and the second delay locking unit share the shared delay line configured to output the first and second internal clocks in response to the first and second delay control signals.

6. A delay locked loop circuit for compensating a phase skew of a memory device, comprising:
   a first delay locking unit configured to delay an external clock by a first amount of delay to output a first internal clock;
   a second delay locking unit configured to delay the external clock by a second amount of delay according to the phase comparison result of the first internal clock and a second internal clock to output the second internal clock, where the second amount of delay is greater than the first amount of delay; and
   a selecting unit configured to select one of the first internal clock and the second internal clock as an internal clock of the memory device, wherein the selecting unit selects the second internal clock when the first delay locking unit cannot compensate for the phase skew.

7. The delay locked loop circuit as recited in claim 6, wherein the first delay locking unit includes
   a first phase comparator configured to compare a phase of the external clock with a phase of a feedback clock to calculate the first amount of delay of the external clock,
   a first delay unit configured to output the first internal clock according to the first amount of delay, and
   a first replica model configured to delay an output signal of the selecting unit according to a predetermined delay modeling to output the feedback clock.

8. The delay locked loop circuit as recited in claim 7, wherein the first delay unit enables a selection signal when the first amount of delay cannot be reduced, and the selecting unit selects the second internal clock in response to the selection signal.

9. The delay locked loop circuit as recited in claim 8, wherein the second delay locking unit includes:
- a second phase comparator configured to receive the first internal clock to compare the first internal clock with a phase of the second internal clock, and the first internal clock with a phase of a delayed second internal clock to calculate the second amount of delay of the external clock, and
- a second delay unit configured to output the second internal clock according to the second amount of delay.

10. The delay locked loop circuit as recited in claim 9, wherein the second phase comparator includes
- a phase detector including
  - a first comparator configured to compare a phase of the delayed second internal clock with a phase of the first internal clock in order to make the second amount of delay be greater than the first amount of delay, and
  - a second comparator configured to compare and output a phase of the second internal clock with a phase of the first internal clock when the selection signal is disabled, and output a result of comparing a phase of the external clock with a phase of the feedback clock when the selection signal is enabled, and
- a controller configured to calculate the second amount of delay in response to the phase comparison results of the first and second comparators.

11. The phase delay locked loop circuit as recited in claim 6, wherein the first delay locking unit includes
- a first phase comparator configured to compare a phase of the external clock with a phase of a feedback clock to calculate the first amount of delay of the external clock,
- a first delay controller configured to output a first delay control signal for delaying the external clock according to the first amount of delay, and
- a replica model configured to delay an output signal of the selecting unit according to a predetermined delay modeling to output the feedback clock, the second delay locking unit including
- a second phase comparator configured to receive the first internal clock to compare a phase of the second internal clock with a phase of a delayed second internal clock to calculate the second amount of delay of the external clock; and
- a second delay controller configured to output a second delay control signal for delaying the external clock according to the second amount of delay, and the first delay locking unit and the second delay locking unit share the shared delay line configured to output the first and second internal clocks in response to the first and second delay control signals.

12. The delay locked loop circuit as recited in claim 11, wherein the shared delay line includes a plurality of delay units connected in series, the delay unit including
- a transfer unit configured to receive the external clock and power supply voltage to transfer the external clock to a next delay unit,
- a first delay unit configured to output the first internal clock in response to the first delay control signal, and
- a second delay unit configured to output the second internal clock in response to the second delay control signal.

13. A delay locked loop circuit for compensating for a phase skew of a memory device, comprising
- a plurality of delay locking units each having a different amount of delay and configured to delay an external clock of the memory device by the different amount of delay to output a plurality of internal clocks, and
- a selecting unit configured to select one of the internal clocks output from the delay locking units as an internal clock of the memory device, wherein the selecting unit selects the internal clock of the delay locking unit having a larger amount of delay when the delay locking unit having a smaller amount of delay cannot compensate a skew between the internal clock and the external clock.

* * * * *